US008569949B2

(12) United States Patent
Lenk et al.

(10) Patent No.: US 8,569,949 B2
(45) Date of Patent: Oct. 29, 2013

(54) METHOD OF LIGHT DISPERSION AND PREFERENTIAL SCATTERING OF CERTAIN WAVELENGTHS OF LIGHT-EMITTING DIODES AND BULBS CONSTRUCTED THEREFROM

(75) Inventors: Ronald J. Lenk, Woodstock, GA (US); Carol Lenk, Woodstock, GA (US)

(73) Assignee: Switch Bulb Company, Inc., San Jose, CA (US)

( * ) Notice: Subject to any disclaimer, the term of this patent is extended or adjusted under 35 U.S.C. 154(b) by 0 days.

(21) Appl. No.: 13/476,986

(22) Filed: May 21, 2012

(65) Prior Publication Data

US 2012/0229018 A1 Sep. 13, 2012

Related U.S. Application Data

(63) Continuation of application No. 12/299,088, filed as application No. PCT/US2007/010467 on Apr. 27, 2007, now Pat. No. 8,193,702.

(60) Provisional application No. 60/797,118, filed on May 2, 2006.

(51) Int. Cl.
*H01L 23/28* (2006.01)
*H01L 23/29* (2006.01)

(52) U.S. Cl.
USPC .......................................... 313/506; 313/502

(58) Field of Classification Search
USPC ................................................. 313/498–512
See application file for complete search history.

(56) References Cited

U.S. PATENT DOCUMENTS

| | | | |
|---|---|---|---|
| 3,962,675 | A | 6/1976 | Rowley et al. |
| 4,025,290 | A | 5/1977 | Giangiulio |
| 4,039,885 | A | 8/1977 | van Boekhold et al. |
| 4,077,076 | A | 3/1978 | Masters |
| 4,211,955 | A | 7/1980 | Ray |

(Continued)

FOREIGN PATENT DOCUMENTS

| | | | |
|---|---|---|---|
| EP | 0658933 | A2 | 6/1995 |
| JP | 63086484 | A | 4/1988 |

(Continued)

OTHER PUBLICATIONS

Final Office Action received for U.S. Appl. No. 12/299,088, mailed on May 13, 2011, 26 pages.

(Continued)

*Primary Examiner* — Karabi Guharay
*Assistant Examiner* — Nathaniel Lee
(74) *Attorney, Agent, or Firm* — Morrison & Foerster LLP

(57) ABSTRACT

A light emitting diode (LED) bulb configured to scatter certain wavelengths of light. The LED bulb includes a base having threads, a bulb shell, at least one LED, and a plurality of particles disposed within the bulb shell. The plurality of particles has a first and second set of particles. The first set of particles is configured to scatter short wavelength components of light emitted from the at least one LED and has particles with an effective diameter that is a fraction of the dominant wavelength of the light emitted from the at least one LED. The second set of particles is configured to scatter light emitted from the at least one LED, and has particles with an effective diameter equal to or greater than the dominant wavelength of the light emitted from the at least one LED.

21 Claims, 2 Drawing Sheets

(56) References Cited

U.S. PATENT DOCUMENTS 4,271,458 A 6/1981 George, Jr.
4,290,095 A 9/1981 Schmidt
4,325,107 A 4/1982 MacLeod
4,336,855 A 6/1982 Chen
4,346,329 A 8/1982 Schmidt
4,405,744 A 9/1983 Greinecker et al.
4,511,952 A 4/1985 Vanbragt
4,539,516 A 9/1985 Thompson
4,611,512 A 9/1986 Honda
4,647,331 A 3/1987 Koury, Jr. et al.
4,650,509 A 3/1987 Vanbragt
4,656,564 A 4/1987 Felder
4,658,532 A 4/1987 McFarland et al.
4,663,558 A 5/1987 Endo
4,727,289 A 2/1988 Uchida
4,728,999 A 3/1988 Dannatt et al.
4,840,383 A 6/1989 Lombardo
4,843,266 A 6/1989 Szanto et al.
4,875,852 A 10/1989 Ferren
4,876,632 A 10/1989 Osterhout et al.
4,904,991 A 2/1990 Jones
4,916,352 A 4/1990 Haim et al.
4,942,685 A 7/1990 Lin
4,947,300 A 8/1990 Wen
4,967,330 A 10/1990 Bell et al.
4,994,705 A 2/1991 Linder et al.
5,008,588 A 4/1991 Nakahara
5,065,226 A 11/1991 Kluitmans et al.
5,065,291 A 11/1991 Frost et al.
5,075,372 A 12/1991 Hille et al.
5,119,831 A 6/1992 Robin et al.
5,136,213 A 8/1992 Sacchetti
5,140,220 A 8/1992 Hasegawa
5,224,773 A 7/1993 Arimura
5,237,490 A 8/1993 Ferng
5,303,124 A 4/1994 Wrobel
5,358,880 A 10/1994 Lebby et al.
5,377,000 A 12/1994 Berends
5,405,208 A 4/1995 Hsieh
5,463,280 A 10/1995 Johnson
5,496,184 A 3/1996 Garrett et al.
5,514,627 A 5/1996 Lowery et al.
5,528,474 A 6/1996 Roney et al.
5,561,347 A 10/1996 Nakamura et al.
5,585,783 A 12/1996 Hall
5,622,423 A 4/1997 Lee
5,630,660 A 5/1997 Chen
5,632,551 A 5/1997 Roney et al.
5,662,490 A 9/1997 Ogawa
5,664,866 A 9/1997 Reniger et al.
5,667,295 A 9/1997 Tsui
5,684,354 A 11/1997 Gleckman
5,685,637 A 11/1997 Chapman et al.
5,688,042 A 11/1997 Madadi et al.
5,726,535 A 3/1998 Yan
5,803,588 A 9/1998 Costa
5,807,157 A 9/1998 Penjuke
5,813,753 A 9/1998 Vriens et al.
5,887,967 A 3/1999 Chang
5,890,794 A 4/1999 Abtahi et al.
5,892,325 A 4/1999 Gleckman
5,899,557 A 5/1999 McDermott
5,929,568 A 7/1999 Eggers
5,931,562 A 8/1999 Arato
5,931,570 A 8/1999 Yamuro
5,936,599 A 8/1999 Reymond
5,941,626 A 8/1999 Yamuro
5,947,588 A 9/1999 Huang
5,952,916 A 9/1999 Yamabe
5,963,126 A 10/1999 Karlin et al.
5,982,059 A 11/1999 Anderson
5,984,494 A 11/1999 Chapman et al.
6,003,033 A 12/1999 Amano et al.
6,043,591 A 3/2000 Gleckman
6,066,861 A 5/2000 Hohn et al.
6,087,764 A 7/2000 Matei
6,095,671 A 8/2000 Hutain
6,102,809 A 8/2000 Nichols
6,120,312 A 9/2000 Shu
6,123,631 A 9/2000 Ginder
6,147,367 A 11/2000 Yang et al.
6,158,451 A 12/2000 Wu
6,183,310 B1 2/2001 Shu
6,184,628 B1 2/2001 Ruthenberg
6,227,679 B1 5/2001 Zhang et al.
6,254,939 B1 7/2001 Cowan et al.
6,258,699 B1 7/2001 Chang et al.
6,268,801 B1 7/2001 Wu
6,273,580 B1 8/2001 Coleman et al.
6,276,822 B1 8/2001 Bedrosian et al.
6,277,685 B1 8/2001 Lin et al.
6,313,892 B2 11/2001 Gleckman
6,316,911 B1 11/2001 Moskowitz et al.
6,332,692 B1 12/2001 McCurdy
6,338,647 B1 1/2002 Fernandez et al.
6,357,902 B1 3/2002 Horowitz
6,382,582 B1 5/2002 Brown
6,426,704 B1 7/2002 Hutchison
6,471,562 B1 10/2002 Liu
6,478,449 B2 11/2002 Lee et al.
6,480,389 B1 11/2002 Shie et al.
6,488,392 B1 12/2002 Lu
6,496,237 B1 12/2002 Gleckman
6,504,301 B1 1/2003 Lowery
6,513,955 B1 2/2003 Waltz
6,528,954 B1 3/2003 Lys et al.
6,534,988 B2 3/2003 Flory, IV
6,541,800 B2 4/2003 Barnett et al.
6,547,417 B2 4/2003 Lee
6,568,834 B1 5/2003 Scianna
6,582,100 B1 6/2003 Hochstein et al.
6,608,272 B2 8/2003 Garcia
6,612,712 B2 9/2003 Nepil
6,619,829 B1 9/2003 Chen
6,626,557 B1 9/2003 Taylor
6,639,360 B2 10/2003 Roberts et al.
6,655,810 B2 12/2003 Hayashi et al.
6,659,632 B2 12/2003 Chen
6,685,852 B2 2/2004 Setlur et al.
6,709,132 B2 3/2004 Ishibashi
6,711,426 B2 3/2004 Benaron et al.
6,713,961 B2 3/2004 Honda et al.
6,734,633 B2 5/2004 Matsuba et al.
6,741,029 B2 5/2004 Matsubara et al.
6,742,907 B2 6/2004 Funamoto et al.
6,746,885 B2 6/2004 Cao
6,750,824 B1 6/2004 Shen
6,773,192 B1 8/2004 Chao
6,789,348 B1 9/2004 Kneller et al.
6,791,259 B1 * 9/2004 Stokes et al. .................. 313/503
6,791,283 B2 9/2004 Bowman et al.
6,793,362 B2 9/2004 Tai
6,793,363 B2 9/2004 Jensen
6,796,698 B2 9/2004 Sommers et al.
6,805,461 B2 10/2004 Witte
6,819,049 B1 11/2004 Bohmer et al.
6,819,056 B2 11/2004 Lin
6,828,590 B2 12/2004 Hsiung
6,842,204 B1 1/2005 Johnson
6,864,513 B2 3/2005 Lin et al.
6,864,554 B2 3/2005 Lin et al.
6,881,980 B1 4/2005 Ting
6,886,963 B2 5/2005 Lodhie
6,903,380 B2 6/2005 Barnett et al.
6,905,231 B2 6/2005 Dickie
6,910,794 B2 6/2005 Rice
6,911,678 B2 6/2005 Fujisawa et al.
6,911,915 B2 6/2005 Wu et al.
6,926,973 B2 8/2005 Suzuki et al.
6,927,683 B2 8/2005 Sugimoto et al.
6,932,638 B1 8/2005 Burrows et al.
6,936,857 B2 8/2005 Doxsee et al.
6,943,357 B2 9/2005 Srivastava et al.
6,948,829 B2 9/2005 Verdes et al.

(56) References Cited

U.S. PATENT DOCUMENTS

| | | | |
|---|---|---|---|
| 6,956,243 | B1 | 10/2005 | Chin |
| 6,963,688 | B2 | 11/2005 | Nath |
| 6,964,878 | B2 | 11/2005 | Horng et al. |
| 6,967,445 | B1 | 11/2005 | Jewell et al. |
| 6,971,760 | B2 | 12/2005 | Archer et al. |
| 6,974,924 | B2 | 12/2005 | Agnatovech et al. |
| 6,982,518 | B2 | 1/2006 | Chou et al. |
| 6,983,506 | B1 | 1/2006 | Brown |
| 7,022,260 | B2 | 4/2006 | Morioka |
| 7,042,150 | B2 | 5/2006 | Yasuda |
| 7,058,103 | B2 | 6/2006 | Ishida et al. |
| D525,374 | S | 7/2006 | Maxik et al. |
| 7,073,920 | B2 | 7/2006 | Konkle, Jr. et al. |
| 7,074,631 | B2 | 7/2006 | Erchak et al. |
| 7,075,112 | B2 | 7/2006 | Roberts et al. |
| 7,078,732 | B1 | 7/2006 | Reeh et al. |
| D527,119 | S | 8/2006 | Maxik et al. |
| 7,086,756 | B2 | 8/2006 | Maxik |
| 7,086,767 | B2 | 8/2006 | Sidwell et al. |
| D528,673 | S | 9/2006 | Maxik et al. |
| D531,740 | S | 11/2006 | Maxik |
| D532,532 | S | 11/2006 | Maxik |
| 7,138,666 | B2 | 11/2006 | Erchak et al. |
| 7,161,311 | B2 | 1/2007 | Mueller et al. |
| 7,186,016 | B2 | 3/2007 | Jao |
| 7,213,934 | B2 | 5/2007 | Zarian et al. |
| 7,239,080 | B2 | 7/2007 | Ng et al. |
| 7,241,039 | B2 | 7/2007 | Hulse |
| 7,246,919 | B2 | 7/2007 | Porchia et al. |
| 7,261,454 | B2 | 8/2007 | Ng |
| 7,264,527 | B2 | 9/2007 | Bawendi et al. |
| 7,270,446 | B2 | 9/2007 | Chang et al. |
| 7,288,798 | B2 | 10/2007 | Chang et al. |
| 7,315,119 | B2 | 1/2008 | Ng et al. |
| 7,319,293 | B2 | 1/2008 | Maxik |
| 7,344,279 | B2 | 3/2008 | Mueller et al. |
| 7,350,933 | B2 | 4/2008 | Ng et al. |
| 7,367,692 | B2 | 5/2008 | Maxik |
| 7,396,142 | B2 | 7/2008 | Laizure, Jr. et al. |
| 7,489,031 | B2 | 2/2009 | Roberts et al. |
| 7,513,669 | B2 | 4/2009 | Chua et al. |
| 7,677,765 | B2 | 3/2010 | Tajul et al. |
| 7,884,544 | B2 | 2/2011 | Takezawa et al. |
| 8,154,190 | B2 | 4/2012 | Ishii et al. |
| 2001/0008436 | A1 | 7/2001 | Gleckman |
| 2001/0009400 | A1 | 7/2001 | Maeno et al. |
| 2001/0019134 | A1 | 9/2001 | Chang et al. |
| 2001/0026447 | A1 | 10/2001 | Herrera |
| 2001/0035264 | A1 | 11/2001 | Padmanabhan |
| 2001/0053077 | A1 | 12/2001 | Anwly-Davies et al. |
| 2002/0021573 | A1 | 2/2002 | Zhang |
| 2002/0039872 | A1 | 4/2002 | Asai et al. |
| 2002/0068775 | A1 | 6/2002 | Munzenberger |
| 2002/0070449 | A1 | 6/2002 | Yagi et al. |
| 2002/0085379 | A1 | 7/2002 | Han et al. |
| 2002/0093287 | A1 | 7/2002 | Chen |
| 2002/0097586 | A1 | 7/2002 | Horowitz |
| 2002/0117692 | A1 | 8/2002 | Lin |
| 2002/0126491 | A1 | 9/2002 | Chen |
| 2002/0145863 | A1 | 10/2002 | Stultz |
| 2002/0149312 | A1 | 10/2002 | Roberts et al. |
| 2002/0153829 | A1 | 10/2002 | Asai et al. |
| 2002/0154449 | A1 | 10/2002 | Raphael et al. |
| 2002/0176246 | A1 | 11/2002 | Chen |
| 2002/0183438 | A1 | 12/2002 | Amarasekera et al. |
| 2002/0186538 | A1 | 12/2002 | Kase et al. |
| 2002/0191416 | A1 | 12/2002 | Wesson |
| 2003/0025449 | A1 | 2/2003 | Rossner |
| 2003/0038596 | A1 | 2/2003 | Ho |
| 2003/0043579 | A1 | 3/2003 | Rong et al. |
| 2003/0048632 | A1 | 3/2003 | Archer |
| 2003/0058658 | A1 | 3/2003 | Lee |
| 2003/0072156 | A1 | 4/2003 | Pohlert et al. |
| 2003/0079387 | A1 | 5/2003 | Derose |
| 2003/0111955 | A1 | 6/2003 | McNulty et al. |
| 2003/0128629 | A1 | 7/2003 | Stevens |
| 2003/0142508 | A1 | 7/2003 | Lee |
| 2003/0164666 | A1 | 9/2003 | Crunk |
| 2003/0185020 | A1 | 10/2003 | Stekelenburg |
| 2003/0193841 | A1 | 10/2003 | Crunk |
| 2003/0201903 | A1 | 10/2003 | Shen |
| 2003/0214233 | A1 | 11/2003 | Takahashi et al. |
| 2003/0230045 | A1 | 12/2003 | Krause et al. |
| 2003/0231510 | A1 | 12/2003 | Tawa et al. |
| 2004/0001338 | A1 | 1/2004 | Pine |
| 2004/0004435 | A1 | 1/2004 | Hsu |
| 2004/0004441 | A1 | 1/2004 | Yano |
| 2004/0007980 | A1 | 1/2004 | Shibata |
| 2004/0008525 | A1 | 1/2004 | Shibata |
| 2004/0014414 | A1 | 1/2004 | Horie et al. |
| 2004/0039274 | A1 | 2/2004 | Benaron et al. |
| 2064/0039764 | | 2/2004 | Gonikberg et al. |
| 2064/0056600 | | 3/2004 | Lapatovich et al. |
| 2004/0085017 | A1 | 5/2004 | Lee |
| 2004/0085758 | A1 | 5/2004 | Deng |
| 2004/0101802 | A1 | 5/2004 | Scott |
| 2004/0105262 | A1 | 6/2004 | Tseng et al. |
| 2004/0113549 | A1 | 6/2004 | Roberts et al. |
| 2004/0114352 | A1 | 6/2004 | Jensen |
| 2004/0114367 | A1 | 6/2004 | Li |
| 2004/0125034 | A1 | 7/2004 | Shen |
| 2004/0125515 | A1 | 7/2004 | Popovich |
| 2004/0127138 | A1 | 7/2004 | Huang |
| 2004/0173810 | A1 | 9/2004 | Lin et al. |
| 2004/0179355 | A1 | 9/2004 | Gabor |
| 2004/0183458 | A1 | 9/2004 | Lee |
| 2004/0187313 | A1 | 9/2004 | Zirk et al. |
| 2004/0189262 | A1 | 9/2004 | McGrath |
| 2004/0190305 | A1 | 9/2004 | Arik et al. |
| 2004/0201673 | A1 | 10/2004 | Asai |
| 2004/0207334 | A1 | 10/2004 | Lin |
| 2004/0208002 | A1 | 10/2004 | Wu |
| 2004/0211589 | A1 | 10/2004 | Chou et al. |
| 2004/0217693 | A1 | 11/2004 | Duggal et al. |
| 2004/0233661 | A1 | 11/2004 | Taylor |
| 2004/0245912 | A1 | 12/2004 | Thurk et al. |
| 2004/0257804 | A1 | 12/2004 | Lee |
| 2004/0264192 | A1 | 12/2004 | Nagata et al. |
| 2005/0007010 | A1 | 1/2005 | Lee |
| 2005/0007770 | A1 | 1/2005 | Bowman et al. |
| 2005/0011481 | A1 | 1/2005 | Naumann et al. |
| 2005/0015029 | A1 | 1/2005 | Kim |
| 2005/0018424 | A1 | 1/2005 | Popovich |
| 2005/0023540 | A1 | 2/2005 | Yoko et al. |
| 2005/0030761 | A1 | 2/2005 | Burgess |
| 2005/0031281 | A1 | 2/2005 | Nath |
| 2005/0036299 | A1 | 2/2005 | Tsai |
| 2005/0036616 | A1 | 2/2005 | Huang et al. |
| 2005/0047170 | A1 | 3/2005 | Hilburger et al. |
| 2005/0052885 | A1* | 3/2005 | Wu .............................. 362/565 |
| 2005/0057187 | A1 | 3/2005 | Catalano |
| 2005/0063185 | A1 | 3/2005 | Monjo et al. |
| 2005/0067343 | A1 | 3/2005 | Zulauf et al. |
| 2005/0068776 | A1 | 3/2005 | Ge |
| 2005/0084229 | A1 | 4/2005 | Babbitt et al. |
| 2005/0099787 | A1 | 5/2005 | Hayes |
| 2005/0105302 | A1 | 5/2005 | Hofmann et al. |
| 2005/0110191 | A1 | 5/2005 | Lin |
| 2005/0110384 | A1 | 5/2005 | Peterson |
| 2005/0111234 | A1 | 5/2005 | Martin et al. |
| 2005/0141221 | A1 | 6/2005 | Yu |
| 2005/0151664 | A1 | 7/2005 | Kolish et al. |
| 2005/0152136 | A1 | 7/2005 | Konkle et al. |
| 2005/0162101 | A1 | 7/2005 | Leong et al. |
| 2005/0162864 | A1 | 7/2005 | Verdes et al. |
| 2005/0174065 | A1 | 8/2005 | Janning |
| 2005/0174769 | A1 | 8/2005 | Yong et al. |
| 2005/0174780 | A1 | 8/2005 | Park |
| 2005/0179358 | A1 | 8/2005 | Soules et al. |
| 2005/0179379 | A1 | 8/2005 | Kim |
| 2005/0180136 | A9 | 8/2005 | Popovich |
| 2005/0180137 | A1 | 8/2005 | Hsu |
| 2005/0207152 | A1 | 9/2005 | Maxik |
| 2005/0207159 | A1 | 9/2005 | Maxik |

(56) References Cited

U.S. PATENT DOCUMENTS

| | | | | |
|---|---|---|---|---|
| 2005/0217996 | A1 | 10/2005 | Liu et al. | |
| 2005/0224829 | A1 | 10/2005 | Negley et al. | |
| 2005/0230691 | A1 | 10/2005 | Amiotti et al. | |
| 2005/0233485 | A1 | 10/2005 | Shishov et al. | |
| 2005/0237995 | A1 | 10/2005 | Puranik | |
| 2005/0243539 | A1 | 11/2005 | Evans et al. | |
| 2005/0243550 | A1 | 11/2005 | Stekelenburg | |
| 2005/0243552 | A1 | 11/2005 | Maxik | |
| 2005/0255026 | A1 | 11/2005 | Barker et al. | |
| 2005/0258446 | A1 | 11/2005 | Raos et al. | |
| 2005/0259419 | A1 | 11/2005 | Sandoval | |
| 2005/0265039 | A1 | 12/2005 | Lodhie et al. | |
| 2005/0270780 | A1 | 12/2005 | Zhang | |
| 2005/0276034 | A1 | 12/2005 | Malpetti | |
| 2005/0276051 | A1 | 12/2005 | Caudle et al. | |
| 2005/0276053 | A1 | 12/2005 | Nortrup et al. | |
| 2005/0276072 | A1 | 12/2005 | Hayashi et al. | |
| 2005/0285494 | A1 | 12/2005 | Cho et al. | |
| 2006/0002110 | A1 | 1/2006 | Dowling et al. | |
| 2006/0002125 | A1 | 1/2006 | Kim et al. | |
| 2006/0007410 | A1 | 1/2006 | Masuoka et al. | |
| 2006/0022214 | A1 | 2/2006 | Morgan et al. | |
| 2006/0034077 | A1 | 2/2006 | Chang | |
| 2006/0044803 | A1 | 3/2006 | Edwards | |
| 2006/0050514 | A1 | 3/2006 | Opolka | |
| 2006/0061985 | A1 | 3/2006 | Elkins | |
| 2006/0071591 | A1 | 4/2006 | Takezawa et al. | |
| 2006/0092644 | A1 | 5/2006 | Mok et al. | |
| 2006/0142946 | A1 | 6/2006 | Goujon et al. | |
| 2006/0145172 | A1 | 7/2006 | Su et al. | |
| 2006/0176699 | A1 | 8/2006 | Crunk | |
| 2006/0187653 | A1 | 8/2006 | Olsson | |
| 2006/0193121 | A1 | 8/2006 | Kamoshita | |
| 2006/0193130 | A1 | 8/2006 | Ishibashi | |
| 2006/0198147 | A1 | 9/2006 | Ge | |
| 2006/0208260 | A1 | 9/2006 | Sakuma et al. | |
| 2006/0226772 | A1 | 10/2006 | Tan et al. | |
| 2006/0243997 | A1 | 11/2006 | Yang et al. | |
| 2006/0250802 | A1 | 11/2006 | Herold | |
| 2006/0255353 | A1 | 11/2006 | Taskar et al. | |
| 2006/0261359 | A1 | 11/2006 | Huang | |
| 2006/0273340 | A1 | 12/2006 | Lv | |
| 2006/0274524 | A1 | 12/2006 | Chang et al. | |
| 2006/0289884 | A1 | 12/2006 | Soules et al. | |
| 2007/0018181 | A1 | 1/2007 | Steen et al. | |
| 2007/0031685 | A1* | 2/2007 | Ko et al. | 428/447 |
| 2007/0057364 | A1 | 3/2007 | Wang et al. | |
| 2007/0086189 | A1 | 4/2007 | Raos et al. | |
| 2007/0090391 | A1 | 4/2007 | Diamantidis | |
| 2007/0090737 | A1 | 4/2007 | Hu et al. | |
| 2007/0120879 | A1 | 5/2007 | Kanade et al. | |
| 2007/0125982 | A1 | 6/2007 | Tian et al. | |
| 2007/0139949 | A1 | 6/2007 | Tanda et al. | |
| 2007/0291490 | A1 | 12/2007 | Tajul et al. | |
| 2008/0013316 | A1 | 1/2008 | Chiang | |
| 2008/0048200 | A1 | 2/2008 | Mueller et al. | |
| 2008/0070331 | A1 | 3/2008 | Ke | |
| 2008/0185600 | A1 | 8/2008 | Thomas | |
| 2009/0001372 | A1 | 1/2009 | Arik et al. | |
| 2009/0256167 | A1 | 10/2009 | Peeters et al. | |
| 2009/0324875 | A1 | 12/2009 | Heikkila | |
| 2010/0177534 | A1 | 7/2010 | Ryu et al. | |

FOREIGN PATENT DOCUMENTS

| | | | |
|---|---|---|---|
| JP | 0799372 | A | 4/1995 |
| JP | 3351103 | B2 | 4/1995 |
| WO | 02/061805 | A2 | 8/2002 |
| WO | 2004/100213 | A2 | 11/2004 |
| WO | 2005/060309 | A2 | 6/2005 |
| WO | 2007/069119 | A1 | 6/2007 |
| WO | 2007/130357 | A2 | 11/2007 |
| WO | 2007/130359 | A2 | 11/2007 |
| WO | 2009/054948 | A1 | 4/2009 |

OTHER PUBLICATIONS

Final Office Action received for U.S. Appl. No. 12/299,049, mailed on Jan. 4, 2012, 24 pages.

Non Final Office Action received for U.S. Appl. No. 12/299,049, mailed on Jun. 16, 2011, 74 pages.

Non Final Office Action received for U.S. Appl. No. 12/299,088, mailed on Jun. 21, 2010, 43 pages.

Notice of Allowance received for U.S. Appl. No. 12/299,088, mailed on Apr. 3, 2012, 15 pages.

Office Action received for Chinese Patent Application No. 20078151122, mailed on Apr. 8, 2010, 9 pages of Office Action and 16 pages of English Translation.

Office Action received for Chinese Patent Application No. 200780015303.9, mailed on Jun. 8, 2010, 8 pages of English Translation.

Office Action received for Mexican Patent Application No. MX/a/2008/013870, mailed on Sep. 1, 2010, 4 pages.

International Preliminary Report on Patentability received for PCT Patent Application No. PCT/US2007/10487, mailed on Nov. 27, 2008, 6 pages.

International Search Report received for PCT Patent Application No. PCT/US2007/10467, mailed on Aug. 27, 2008, 1 page.

International Preliminary Report on Patentability received for PCT Patent Application No. PCT/US2007/10469, mailed on Nov. 4, 2008, 12 pages.

International Search Report received for PCT Patent Application No. PCT/US2007/10469, mailed on Aug. 7, 2008, 2 pages.

International Preliminary Report on Patentability received for PCT Patent Application No. PCT/US2003/011984, mailed on May 6, 2010, 5 pages.

International Search Report and Written Opinion received for PCT Patent Application No. PCT/US2008/011984, mailed on Jan. 15, 2009, 6 pages.

International Preliminary Report on Patentability received for PCT Patent Application No. PCT/US2009/005030, mailed on Mar. 24, 2011, 9 pages.

International Search Report received for PCT Patent Application No. PCT/US2009/005030, mailed on Nov. 12, 2009, 2 pages.

Ryu et al., "Liquid Crystalline Assembly of Rod—Coil Molecules", Structure & Bonding, vol. 128, 2008, pp. 63-98.

Office Action received for NZ Patent Application No. 573336, mailed on Apr. 10, 2010, 2 pages.

Non Final Office Action received for U.S. Appl. No. 12/299,049, mailed on Mar. 16, 2012, 11 pages.

Non Final Office Action received for U.S. Appl. No. 12/739,944, mailed on May 16, 2012, 55 pages.

Final Office Action received for U.S. Appl. No. 12/299,049, mailed on Sep. 5, 2012, 15 pages.

Extended European Search Report received for European Patent Application No. 08842545.9, mailed on Jul. 26, 2012, 7 Pages.

Supplementary European Search Report and Search Opinion for European Patent Application No. 07756165.2, mailed on Sep. 22, 2011, 6 pages.

Notice of Allowance received for U.S. Appl. No. 12/739,944, mailed on Nov. 26, 2012, 12 pages.

* cited by examiner

METHOD OF LIGHT DISPERSION AND PREFERENTIAL SCATTERING OF CERTAIN WAVELENGTHS OF LIGHT-EMITTING DIODES AND BULBS CONSTRUCTED THEREFROM

CROSS-REFERENCE TO RELATED APPLICATION

This application is a Continuation of U.S. patent application Ser. No. 12/299,088, with a filing date of Oct. 30, 2008, which is an application filed under 35 U.S.C. §371 and claims priority to International Application Serial No. PCT/US2007/010467, filed Apr. 27, 2007, which claims priority to U.S. Patent Provisional Application No. 60/797,118 filed May 2, 2006 which is incorporated herein by this reference in its entirety.

FIELD OF THE INVENTION

The present invention relates to light-emitting diodes (LEDs), and to replacement of bulbs used for lighting by LED bulbs. More particularly, it relates to the preferential scattering of certain wavelengths of light and dispersion of the light generated by the LEDs in order to permit the LEDs to more closely match the color of incandescent bulbs, or to the preferential scattering of certain wavelengths of light and dispersion of the light of the LEDs used in the replacement bulbs to match the light color and spatial pattern of the light of the bulb being replaced.

BACKGROUND OF THE INVENTION

An LED consists of a semi-conductor junction, which emits light due to a current flowing through the junction. At first sight, it would seem that LEDs should make an excellent replacement for the traditional tungsten filament incandescent bulb. At equal power, they give far more light output than do incandescent bulbs, or, what is the same thing, they use much less power for equal light; and their operational life is orders of magnitude larger, namely, 10-100 thousand hours vs. 1-2 thousand hours.

However, LEDs, and bulbs constructed from them, suffer from problems with color. "White" LEDs, which are typically used in bulbs, are today made from one of two processes. In the more common process, a blue-emitting LED is covered with a plastic cap, which, along with other possible optical properties, is coated with a phosphor that absorbs blue light and re-emits light at other wavelengths. A major research effort on the part of LED manufacturers is design of better phosphors, as phosphors presently known give rather poor color rendition. Additionally, these phosphors will saturate if over-driven with too much light, letting blue through and giving the characteristic blue color of over-driven white LEDs.

An additional problem with the phosphor process is that quantum efficiency of absorption and re-emission is less than unity, so that some of the light output of the LED is lost as heat, reducing the luminous efficacy of the LED, and increasing its thermal dissipation problems.

The other process for making a "white" LED today is the use of three (or more) LEDs, typically red, blue and green (RGB), which are placed in close enough proximity to each other to approximate a single source of any desired color. The problem with this process is that the different colors of LEDs age at different rates, so that the actual color produced varies with age. One additional method for getting a "white LED" is to use a colored cover over a blue or other colored LED, such as that made by JKL Lamps™. However, this involves significant loss of light.

LED bulbs have the same problems as do the LEDs they use, and further suffer from problems with the fact the LEDs are point sources. Attempts to do color adjustment by the bulb results in further light intensity loss.

Furthermore, an LED bulb ought to have its light output diffused, so that it has light coming out approximately uniformly over its surface, as does an incandescent bulb, to some level of approximation. In the past, LEDs have had diffusers added to their shells or bodies to spread out the light from the LED. Another method has been to roughen the surface of the LED package. Neither of these methods accomplishes uniform light distribution for an LED bulb, and may lower luminous efficiency. Methods of accomplishing approximate angular uniformity may also involve partially absorptive processes, further lowering luminous efficacy. Additionally, RGB (red, green, blue) systems may have trouble mixing their light together adequately at all angles.

This invention has the object of developing a means to create light from LEDs and LED bulbs that are closer to incandescent color than is presently available, with little or no loss in light intensity.

SUMMARY OF THE INVENTION

In one embodiment of the present invention, at least one shell that is normally used to hold a phosphor that converts the blue light from an LED die to "white" light contains particles of a size a fraction of the dominant wavelength of the LED light, which particles Rayleigh scatter the light, causing preferential scattering of the red. In another embodiment of the present invention, the at least one shell has both the phosphor and the Rayleigh scatterers.

A further object of this invention is developing a means to create light from LED bulbs that is closer to incandescent color than is available using presently available-methods, with little or no loss in light intensity. In one embodiment of the present invention, the bulb contains particles of a size a fraction of the dominant wavelength of the LED light, which particles Rayleigh scatter the light, causing preferential scattering of the red. In another embodiment of the present invention, only the at least one shell of the bulb has the Rayleigh scatterers.

A yet further object of this invention is developing a means to disperse light approximately evenly over the surface of an LED bulb, with little or no loss in light intensity. In one embodiment of the present invention, the bulb contains particles with size one to a few times larger than the dominant wavelength of the LED light, or wavelengths of multiple LEDs in a color-mixing system, which particles Mie scatter the light, causing dispersion of the light approximately evenly over the surface of the bulb. In another embodiment of the present invention, only the at least one shell of the bulb has the Mie scatterers.

In accordance with another embodiment, the method comprises emitting light from at least one LED; and dispersing the light from the at least one LED by distributing a plurality of particles having a size one to a few times larger than a dominant wavelength of the light from the at least one LED or wavelengths of multiple LEDs in a color-mixing system in at least one shell of the LED bulb.

In accordance with a further embodiment, a method for creating light in an LED bulb that is closer to incandescent color than is available using presently available methods, the method comprises: emitting light from at least one LED; and preferential scattering of the red light from the at least one LED by dispersing a plurality of particles having a size a fraction of a dominant wavelength of the light from the at least one LED or wavelengths of multiple LEDs in a color-mixing system in an outer shell of the LED bulb.

In accordance with another embodiment, a method for dispersing light in an LED bulb, the method comprises: emitting light from at least one LED; and scattering the light from the at least one LED by distributing a plurality of particles having a size one to a few times larger than a dominant wavelength of the light from the at least one LED or wavelengths of multiple LEDs in a color-mixing system in an LED bulb.

In accordance with a further embodiment, a method for preferentially scattering light in an LED bulb, the method comprises emitting light from at least one LED; and scattering the light from the at least one LED by distributing a plurality of particles having a size one to a few times larger than a dominant wavelength of the light from the at least one LED or wavelengths of multiple LEDs in a color-mixing system in an LED bulb.

In accordance with another embodiment, an LED comprises an LED die; a shell encapsulating or partially encapsulating the die and having a plurality of particles dispersed therein, and wherein the plurality of particles are such a size as to disperse and/or preferentially scatter the wavelength of the light emitted from the LED.

In accordance with a further embodiment, an LED bulb comprises a bulb having at least one shell having a plurality of particle dispersed therein or in the bulb; at least one LED inside or optically coupled to said bulb; and wherein said plurality of particles are of such a size as to disperse and/or preferentially scatter the wavelength of the light emitted from the at least one LED.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
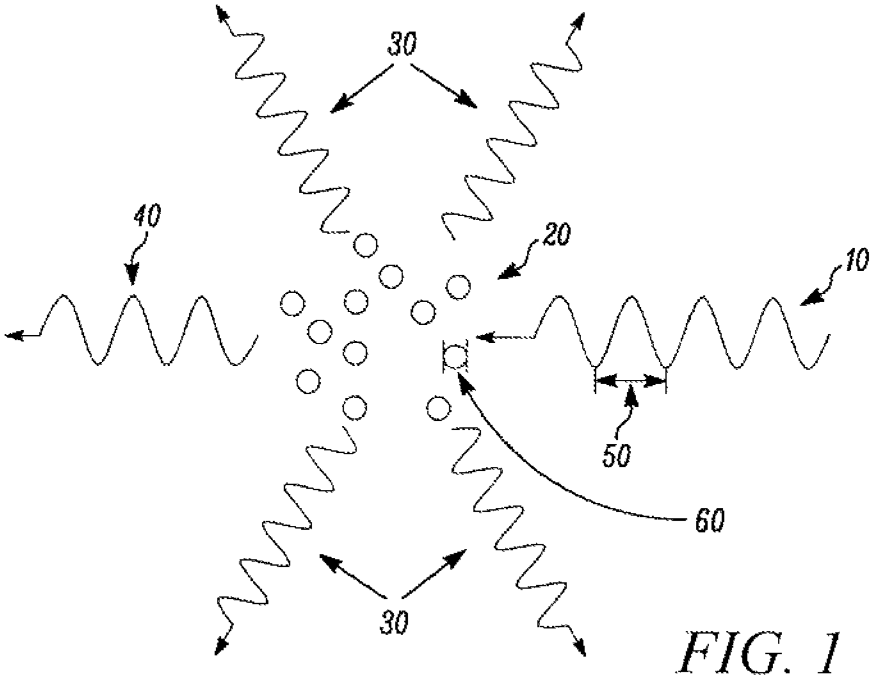
FIG. 1 is a cross-sectional view of light emitted from an LED having Rayleigh scattering from sub-wavelength particles.

Reference will now be made in detail to the present preferred embodiments of the invention, examples of which are illustrated in the accompanying drawings. Wherever possible, the same reference numbers are used in the drawings and the description to refer to the same or like parts. According to the design characteristics, a detailed description of each preferred embodiment is given below.

FIG. 1 shows a cross-sectional view of light emitted from an LED being Rayleigh scattered from sub-wavelength particles 20 in accordance with a first embodiment. As shown in FIG. 1, typically the incoming light 10 will include a plurality of wavelength components, including a wavelength 50 based on the light-emitting material used within the LED (not shown). For example, in a typical LED emission spectrum, the wavelength 50 emitted from the LED corresponding to the color blue will be approximately 430 nm. As shown in FIG. 1, the incoming light 10 impinges on a dispersed set or plurality of particles 20 with an effective diameter 60. The effective diameter 60 is preferably a fraction of the dominant wavelength 50, which creates the condition for Rayleigh scattering of the incoming light 10. For example, the dispersed set of particles 20 can be 80 nm alumina particles. It can be appreciated that other suitable particles having an effective diameter 60, which is a fraction of the wavelength 50 of the emitting light source or LED and creates Rayleigh scattering can be used. It can be appreciated that the particles need not be spherical, or even approximately spherical, and that other shapes can be used such as disk or rod-shaped particles. As shown in FIG. 1, the short wavelength components 30 are scattered by the particles 20, while the transmitted light 40 having long wavelength components are substantially unaffected. The transmitted light 40 is thus enhanced in the color red relative to the incoming light 10, without significantly affecting light intensity.

Figure 2:
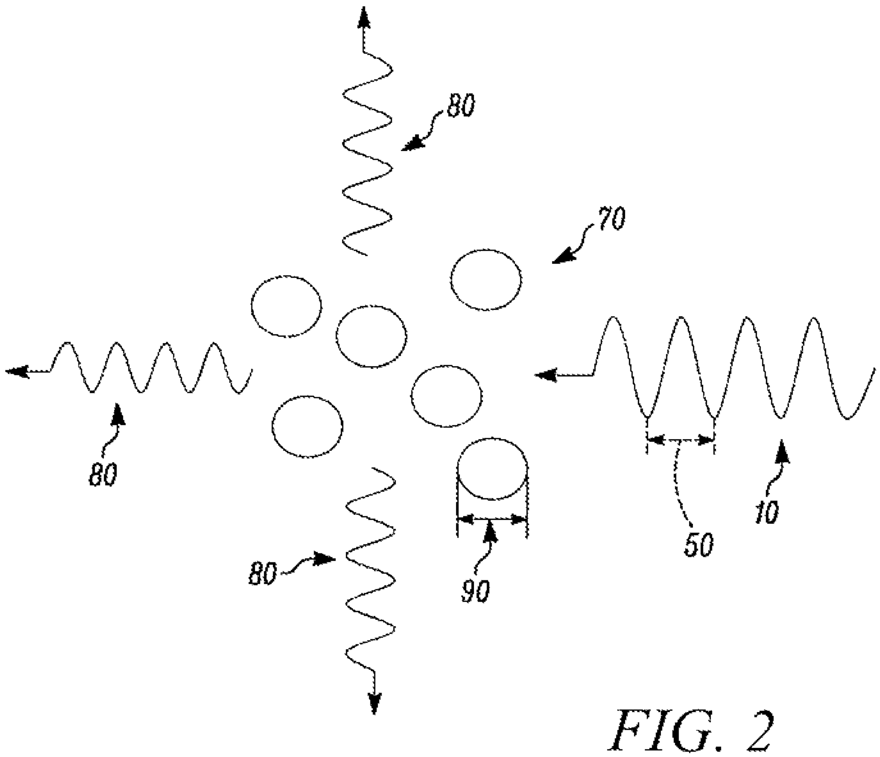
FIG. 2 is a cross-sectional view of light emitted from an LED having Mie scattering from supra-wavelength particles.

FIG. 2 shows a cross-sectional view of light emitted from an LED having Mie scattering from a plurality of supra-wavelength particles 70 and an equal scattering of each of the wavelengths 80 according to a further embodiment. Typically the incoming light 10 will include a plurality of wavelength components, including a wavelength 50 based on the light-emitting material used within the LED (not shown). For example, in a typical LED emission spectrum, the wavelength 50 emitted from the LED corresponding to the color blue will be approximately 430 nm. As shown in FIG. 2, the incoming light 10 impinges on a dispersed set or plurality of particles 70 having an effective diameter 90, wherein the effective diameter 90 is greater than a dominant wavelength 50 of light emitted from the LED. The effective diameter 90 of the dispersed particles 70 are preferably a size one to a few times larger than a dominant wavelength 50 of the light emitting source. For example, for an LED producing a blue light, the dispersed set of particles 70 can be alumina trihydrate having a diameter of approximately 1.1 microns. It can be appreciated that any suitable particles having an effective diameter 90, which is greater than the dominant wavelength 50 of the emitting light source or LED and creates Mie scattering can be used. It can be appreciated that the particles need not be spherical, or even approximately spherical, and that other shapes can be used such as disk or rod-shaped particles. This creates the condition for Mie scattering of the incoming light 10, wherein each of the incoming wavelengths 50 are scattered into an outgoing wavelength 80. The transmitted light or outgoing wavelengths 80 are thus dispersed in directions relative to the incoming light 10, without significantly affecting the light intensity.

Figure 3:
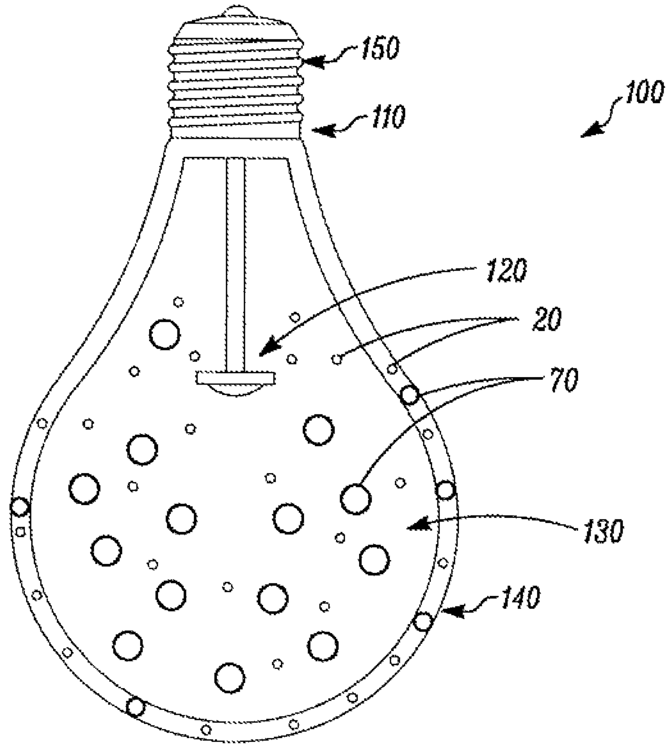
FIG. 3 is a cross-sectional view of an LED bulb showing an LED embedded in a bulb, and the bulb and its shell containing both Rayleigh and Mie scatterers.

FIG. 3 shows a cross-sectional view of a Rayleigh and Mie scattering system 100 having an LED bulb 10 with an LED 120 embedded in the bulb 110 in accordance with one embodiment. The bulb 100 comprises an LED 120 embedded in an inner portion 130 of the bulb 110 and having an outer surface or shell 140, and a base 150 having threads. The LED bulb 100 contains within it at least one LED 120, which is emitting light. As shown in FIG. 3, the inner portion 130 and the shell 140 of the bulb 110 containing a dispersed set of particles 20, 70, to produce scattering of the light produced from the LED 120 in accordance with both Rayleigh and Mie scattering. The light emitted from the LED 120 may contain several wavelengths, but is undesirably enhanced in the blue due to limitations in current LED technology. In order to preferentially scatter the light emitted from the LED 120, the bulb shell 140 and the body or inner portion 130 of the bulb 110 contain both dispersed set of particles 20, 70 having a wavelength corresponding to both Rayleigh scattering 20 and Mie scattering 70. In the case of a LED 120, which produces a blue light, the dispersed set of particles 20, 70 produces light, which is more like an incandescent than the light emitted from the LED 120, (i.e., does not appear to be as blue) as well as being more dispersed than the light emission angle from the LED 120 would otherwise permit. It can be appreciated that the bulb 110 can have more than one shell 140, and that one or more of the shells 140 or the inner portion 130 can contain dispersed particles 20, 70, which produce Rayleigh and/or Mie scattering.

Figure 4:
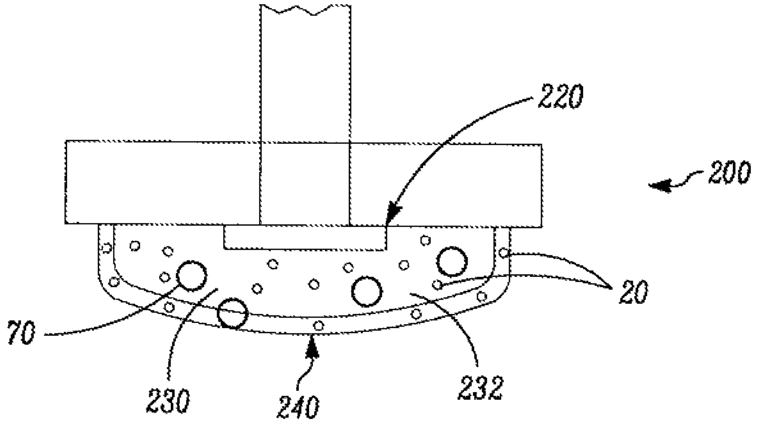
FIG. 4 is a cross-sectional view of an LED showing an LED die embedded in plastic, and the plastic and its shell containing both Rayleigh and Mie scatterers.

FIG. 4 shows a cross-sectional view of an LED 200 showing the LED die 220 embedded in a plastic material 230 in accordance with another embodiment. The LED die 220 is embedded in a plastic material 230 or inner portion 232 and includes a shell 240. The plastic material 230 and the shell 240 each contain a plurality of dispersed particles 20, 70 therein. The plurality of dispersed particles 20, 70 each having an effective diameter to produce Rayleigh and Mie scattering of the light produced by the LED 200. As shown in FIG. 4, the LED 200 contains within it at least one LED die 220, which is emitting a source of light having a defined set of wavelengths. Typically, the LED die 200 and the corresponding source of light will contain many wavelengths, but is undesirably enhanced in the blue and ultraviolet due to limitations in current technology. The LED shell 240 typically is coated with a phosphor that converts some of the light to a lower frequency, making the light color closer to incandescent, but still undesirably enhanced in blue. In the LED 200, the shell 240 and the body of the LED 230 contain both dispersed particles 20, 70, each having an effective diameter 60, 90 to produce Rayleigh and Mie scatterering of the source of light. The result is that the light emitted from the LED 200 is both less blue and more incandescent than the light emitted from the LED die 220, as well as being more dispersed than the light emission angle from the LED die 220 would otherwise permit. The addition of the dispersed particles 20, 70, can be in addition to the phosphor and optics that may be normally added to the LED 200.

What is claimed is:

1. A light emitting diode (LED) light bulb, comprising:

a base having threads;

a bulb shell connected to the base and enclosing an inner portion of the LED bulb;

a plurality of particles disposed within the bulb shell;

at least one LED centrally located in the inner portion of the LED bulb, the at least one LED configured to emit light at a dominant wavelength; and wherein said plurality of particles comprises:

a first set of particles configured to scatter short wavelength components of the light emitted from the at least one LED, where the particles of the first set have an effective diameter that is a fraction of the dominant wavelength of the light emitted from the at least one LED; and a second set of particles configured to scatter the light emitted from the at least one LED, wherein the particles of the second set comprise a non-phosphor material different than the particles of the first set and have an effective diameter equal to or greater than the dominant wavelength of the light emitted from the at least one LED.

2. The LED bulb of claim 1, wherein the first set of particles is configured to scatter short wavelength components of the light emitted from the at least one LED by Rayleigh scattering.

3. The LED bulb of claim 1, wherein the second set of particles is configured to scatter the light emitted from the at least one LED by Mie scattering.

4. The LED bulb of claim 1, wherein the bulb shell has a thickness and at least a portion of the plurality of particles is dispersed within the thickness of the bulb shell.

5. The LED bulb of claim 1, wherein the at least one LED is configured to emit light having a wavelength of about 430 nanometers.

6. The LED bulb of claim 1, wherein the first set of particles is alumina particles.

7. The LED bulb of claim 1, wherein the second set of particles has particles with an effective diameter of about 1.1 microns.

8. The LED bulb of claim 1, wherein the first set of particles has particles with an effective diameter of about 80 nanometers.

9. The LED bulb of claim 1, wherein the plurality of particles includes particles with at least one of the shapes selected from the group consisting of spherical, approximately spherical, disk-shaped, and rod-shaped, or any combination thereof.

10. The LED bulb of claim 1, wherein the second set of particles is alumina trihydrate particles.

11. The LED bulb of claim 1, wherein the second set of particles includes particles with an effective diameter of about 1.1 microns.

12. The LED bulb of claim 1, wherein the bulb shell contains a phosphor.

13. The LED bulb of claim 1, further comprising optics configured to disperse the light emitted from the at least one LED.

14. The LED bulb of claim 1, wherein the at least one LED is a blue LED.

15. A method of making an LED bulb, comprising:

connecting a bulb shell to base to enclose an inner portion of the LED bulb, wherein at least one LED is centrally located in the inner portion of the LED bulb; and disposing a plurality of particles within the bulb shell, wherein said plurality of particles comprises:

a first set of particles configured to scatter short wavelength components of light emitted from the at least one LED, wherein the particles of the first set have an effective diameter that is a fraction of a dominant wavelength of the light emitted from the at least one LED; and a second set of particles configured to scatter the light emitted from the at least one LED, wherein the particles of the second set comprise a non-phosphor material different than the particles of the first set and have an effective diameter equal to or greater than the dominant wavelength of the light emitted from the at least one LED.

16. The method of making an LED bulb of claim 15, wherein the second set of particles is alumina trihydrate particles.

17. The method of making an LED bulb of claim 15, wherein the second set of particles has particles with an effective diameter of about 1.1 microns.

18. The method of making an LED bulb of claim 15, wherein the one or more LEDs are configured to emit light having a wavelength of about 430 nanometers.

19. The method of making an LED bulb of claim 15, wherein the first set of particles is alumina particles.

20. The method of making an LED bulb of claim 15, wherein the first set of particles has particles with an effective diameter of about 80 nanometers.

21. The method of making an LED bulb of claim 15, wherein the bulb shell contains a phosphor.

* * * * *

UNITED STATES PATENT AND TRADEMARK OFFICE

CERTIFICATE OF CORRECTION

PATENT NO. : 8,569,949 B2
APPLICATION NO. : 13/476986
DATED : October 29, 2013
INVENTOR(S) : Ronald J. Lenk et al.

It is certified that error appears in the above-identified patent and that said Letters Patent is hereby corrected as shown below:

In the Specification

In column 5, line 37, delete “scatterering” and insert -- scattering --, therefor.

Signed and Sealed this
Fifth Day of August, 2014

Michelle K. Lee
*Deputy Director of the United States Patent and Trademark Office*